United States Patent
Harada et al.

(10) Patent No.: US 8,461,020 B2
(45) Date of Patent: Jun. 11, 2013

(54) DEVICE PROCESSING METHOD

(75) Inventors: Seiji Harada, Ota-Ku (JP); Yoshikazu Kobayashi, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/450,968

(22) Filed: Apr. 19, 2012

(65) Prior Publication Data
US 2012/0289027 A1 Nov. 15, 2012

(30) Foreign Application Priority Data

May 12, 2011 (JP) .................................. 2011-107003

(51) Int. Cl.
*H01L 21/46* (2006.01)
(52) U.S. Cl.
USPC .................................. 438/462; 257/E21.596
(58) Field of Classification Search
USPC ................. 438/110, 113, 114, 458, 460, 461, 438/462; 257/E21.596, E21.599
See application file for complete search history.

(56) References Cited

U.S. PATENT DOCUMENTS 6,680,241 B2 1/2004 Okamoto et al.
7,638,858 B2 * 12/2009 Kurosawa et al. ............ 257/622

FOREIGN PATENT DOCUMENTS

| JP | 2002-192370 | 7/2002 |
| JP | 2005-086161 | 3/2005 |
| JP | 2006-080329 | 3/2006 |
| JP | 2009-026992 | 2/2009 |

* cited by examiner

*Primary Examiner* — Quoc Hoang
(74) *Attorney, Agent, or Firm* — Greer, Burns & Crain, Ltd.

(57) ABSTRACT

In a device processing method, a laser beam is applied to a wafer along division lines from the back side of the wafer, thereby forming a division start point inside the wafer along the division lines at a depth not reaching the finished thickness of each device. A protective member is attached to the front side of the wafer before or after performing the division start points are formed. An external force is applied through the protective member to the wafer, thereby dividing the wafer along the division lines to obtain the individual devices. The back side of the wafer is ground to remove the modified layers, and a silicon nitride film is formed on at least the side surface of each device. The silicon nitride film has a gettering effect and is formed on the side surface of each device, which surface is formed by a cleavage plane.

3 Claims, 13 Drawing Sheets

FIG.13

| Film thickness [nm] | Before forced contamination | After forced contamination | |
|---|---|---|---|
| | Mean value | Mean value | Maximum value |
| 200 | ND | ND | ND |
| 100 | ND | ND | ND |
| 50 | ND | ND | ND |
| 10 | ND | ND | ND |
| 7 | ND | ND | ND |
| 6 | ND | ND | ND |
| 5 | ND | 1.62 | 23.24 |
| 3 | ND | 9.71 | 84.81 |
| 1 | ND | 11.05 | 80.05 |
| 0 | ND | 9.73 | 106.24 |

Mean value and maximum value are measured in $1.0 \times 10^{10}$ [atoms/cm²]

DEVICE PROCESSING METHOD

BACKGROUND OF THE INVENTION

1. Field of the Invention

The present invention relates to a device processing method including the steps of dividing a wafer into individual devices and forming a silicon nitride film on at least the side surface of each device, thereby producing a gettering effect in each device.

2. Description of the Related Art

A plurality of devices such as ICs and LSIs are formed on the front side of a silicon substrate so as to be partitioned by a plurality of crossing division lines, thus providing a wafer. The back side of the wafer is ground to reduce the thickness of the wafer to a predetermined thickness. Thereafter, the wafer is divided into the individual devices by using a dicing apparatus and the devices thus obtained are used for various electronic equipment or the like. As a method for dividing the wafer into the individual devices, there has been proposed and put to practical use a technique of focusing a laser beam inside the wafer along the division lines to form a plurality of modified layers inside the wafer along the division lines and next applying an external force to the wafer to thereby break the wafer along the division lines, thus dividing the wafer into the individual devices (see Japanese Patent No. 3408805, for example). By using this technique, the width of each division line can be reduced, so that more devices can be formed from one wafer, thereby improving the productivity.

If the modified layer is left on the side surface of each device, the die strength of each device is reduced. To cope with this problem, there has been proposed a technique of grinding the back side of the wafer after dividing the wafer into the individual devices, thereby removing the modified layers (see Japanese Patent No. 4398686, for example).

SUMMARY OF THE INVENTION

However, it is recognized that each modified layer has a gettering effect such that it attracts heavy metal atoms such as copper atoms to suppress the phenomenon that the heavy metal atoms are moved toward the front side of the wafer (where the devices are formed) to cause a reduction in function of each device. Accordingly, when the back side of the wafer is ground after dividing the wafer into the devices, thereby removing the modified layers, the side surface of each device formed by dividing the wafer becomes a flat cleavage plane without a strain especially in the case that the wafer is formed from a silicon substrate. As a result, the gettering effect of each modified layer is lost to cause a reduction in function of each device.

It is therefore an object of the present invention to provide a device processing method which can ensure a sufficient gettering effect without reducing the die strength of each device even when the modified layers formed inside the wafer by laser processing for dividing the wafer are removed by grinding.

In accordance with an aspect of the present invention, there is provided a device processing method for processing a plurality of devices obtained by dividing a wafer composed of a silicon substrate and the plurality of devices formed on the front side of the silicon substrate so as to be partitioned by a plurality of division lines, the device processing method including a division start point forming step of applying a laser beam to the wafer along the division lines from the back side of the wafer, thereby forming a plurality of modified layers as a division start point inside the wafer along the division lines at a depth not reaching the finished thickness of each device; a protective member attaching step of attaching a protective member to the front side of the wafer before or after performing the division start point forming step; a dividing step of applying an external force through the protective member to the wafer after performing the protective member attaching step and the division start point forming step, thereby dividing the wafer along the division lines to obtain the individual devices; a back grinding step of grinding the back side of the wafer after performing the dividing step, thereby removing the modified layers; and a silicon nitride film forming step of forming a silicon nitride film on at least the side surface of each device after performing the back grinding step.

Preferably, the silicon nitride film is formed both on the side surface of each device and on the back side of each device in the silicon nitride film forming step. Preferably, the thickness of the silicon nitride film to be formed in the silicon nitride film forming step is set to 6 to 100 nm.

According to the present invention, the silicon nitride film having a gettering effect is formed on the side surface of each device, which surface is formed by a cleavage plane from which the modified layer has been removed by the back grinding step. Accordingly, it is possible to suppress the phenomenon that heavy metal atoms such as copper atoms are moved in each device to cause a reduction in function of each device. Further, in the case that the silicon nitride film is formed both on the side surface of each device and on the back side of each device, the back side of each device may be polished to remove a strain, thereby improving a die strength, and at the same time the gettering effect can also be produced.

Further, it was confirmed from a test that when the thickness of the silicon nitride film is 6 nm or more, the gettering effect can be exhibited, whereas when the thickness of the silicon nitride film is greater than 100 nm, the die strength is reduced. Accordingly, by setting the thickness of the silicon nitride film to 6 to 100 nm, the gettering effect can be produced without reducing the die strength of each device.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 13 is a table showing the result of a gettering effect test;

DETAILED DESCRIPTION OF THE PREFERRED EMBODIMENTS

Figure 1:
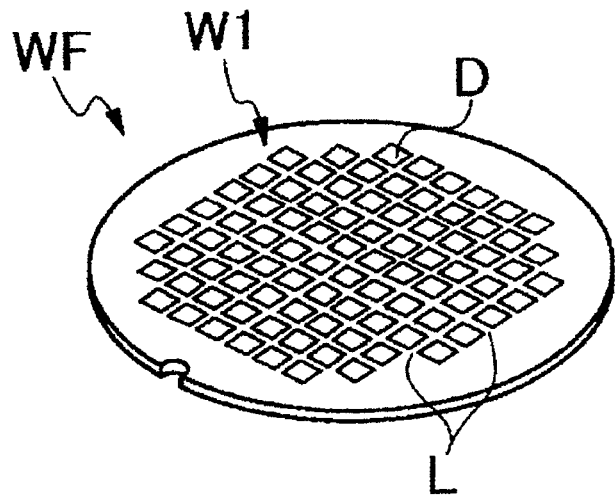
FIG. 1 is a perspective view of a wafer.
Figure 2:
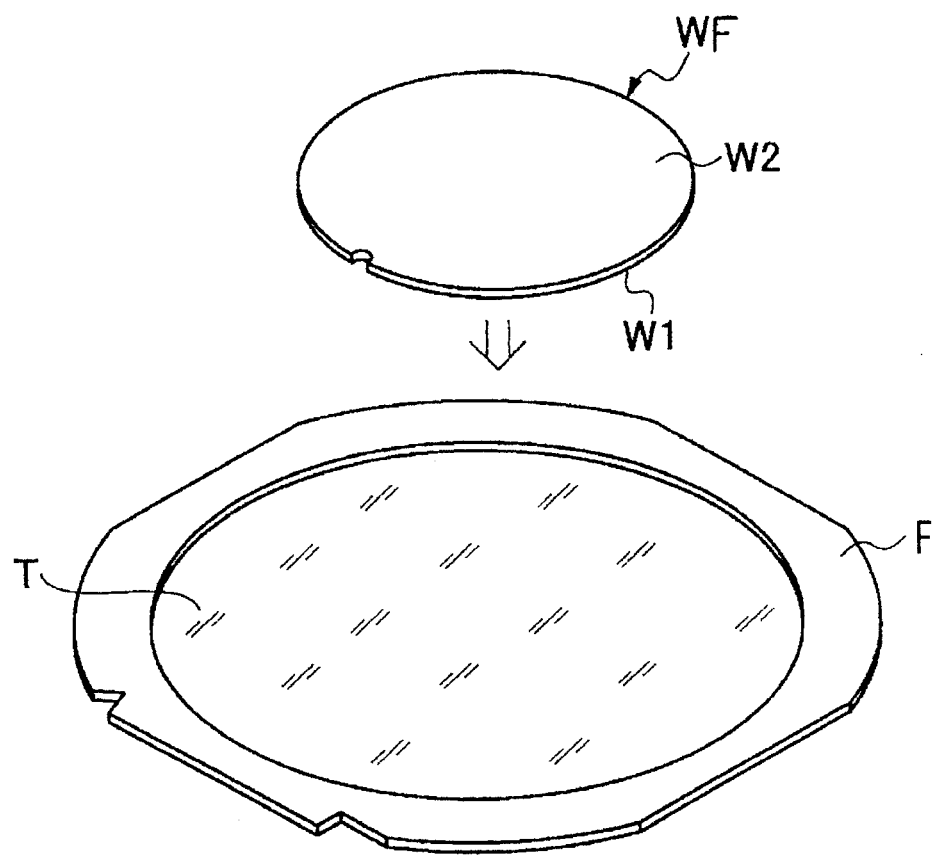
FIG. 2 is a perspective view showing a protective member attaching step.

Referring to FIG. 1, there is shown a wafer WF. The wafer WF is composed of a silicon substrate and a plurality of devices D formed on the front side of the silicon substrate, i.e., on the front side W1 of the wafer WF. These devices D formed on the front side W1 of the wafer WF are partitioned by a plurality of crossing division lines L. The wafer WF is to be cut along the division lines L to obtain the individual devices D respectively corresponding to chips. The wafer WF has a thickness of 500 μm, for example. As shown in FIG. 2, with the device processing method of the present invention, a protective tape T is attached to the front side W1 of the wafer WF. A ringlike frame F is attached to the peripheral portion of the protective tape T. Accordingly, when the front side W1 of the wafer WF is attached to the protective tape T supported to the frame F, the wafer WF is supported through the protective tape T to the frame F in the condition where the back side W2 of the wafer WF is exposed. There will now be described a method of dividing the wafer WF along the division lines L to obtain the individual devices D and next forming a silicon nitride film on the side surface of each device D.

(1) Division Start Point Forming Step

Figure 3:
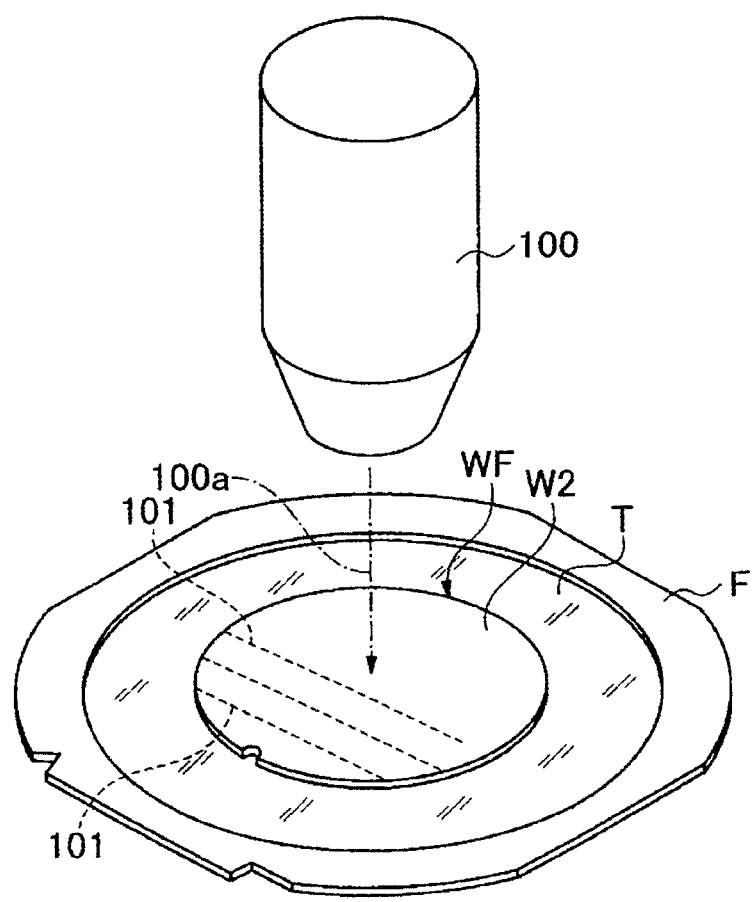
FIG. 3 is a perspective view showing a division start point forming step.

First, imaging of the wafer WF by an infrared camera (not shown) is performed from the back side W2 of the wafer WF to thereby detect the division lines L formed on the front side W1 of the wafer WF. As shown in FIG. 3, a laser beam 100a having a transmission wavelength to the wafer WF is applied by a laser head 100 from the back side W2 of the wafer WF along the division lines L detected above as horizontally feeding the wafer WF, thereby focusing the laser beam 100a inside the wafer WF. This laser processing is performed under the following conditions, for example.

Figure 4:
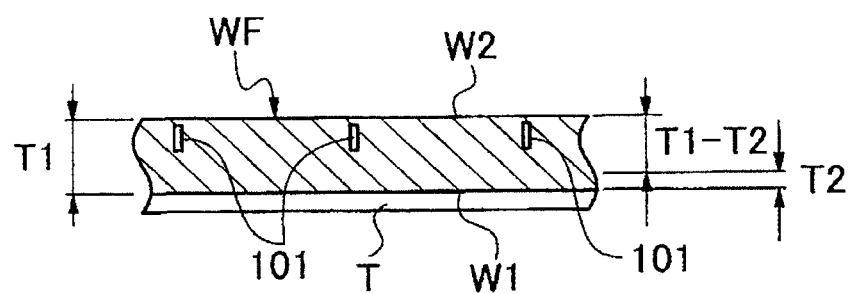
FIG. 4 is a sectional view showing modified layers formed inside the wafer by the division start point forming step.

Light source: YAG laser
Wavelength: 1064 nm
Spot diameter: ϕ2 μm
Average power: 1.2 W
Repetition frequency: 80 kHz
Feed speed: 100 mm/sec This laser processing is performed along all of the division lines L to thereby form a plurality of modified layers 101 as a division start point inside the wafer WF along all of the division lines L as shown in FIG. 4. The depth of each modified layer 101 from the back side W2 of the wafer WF is set to a depth not reaching the finished thickness of each device D. More specifically, in the case that the thickness of the wafer WF is T1 and the finished thickness of each device D is T2 with reference to the front side W1 as shown in FIG. 4, each modified layer 101 is formed in a depth range of (T1-T2) with reference to the back side W2 of the wafer WF. For example, in the case that T1 is 500 μm and T2 is 100 μm, each modified layer 101 is formed in a depth range of 400 μm from the back side W2 of the wafer WF.

(2) Dividing Step

Figure 5:
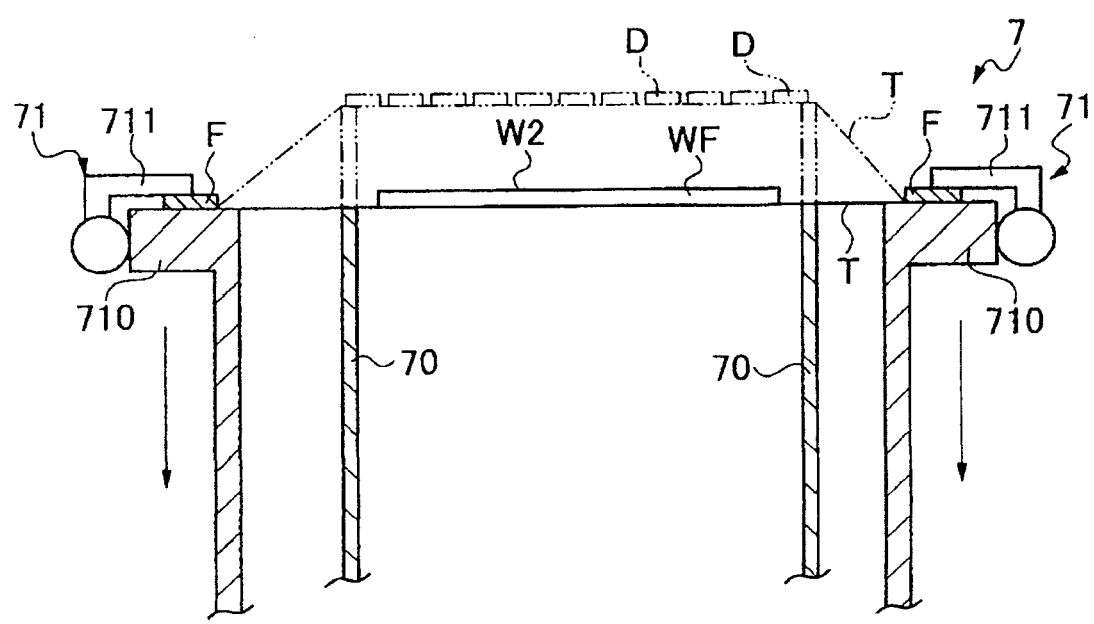
FIG. 5 is a schematic sectional side view showing a dividing step.

After performing the division start point forming step, the wafer WF is divided along the division lines L to obtain the individual devices D by using a dividing apparatus 7 shown in FIG. 5 to apply an external force to the wafer WF. The dividing apparatus 7 includes a cylindrical wafer supporting portion 70 for supporting the lower side of the wafer WF (the protective tape T attached to the front side W1 of the wafer WF) and a frame fixing portion 71 for fixing the frame F supporting the wafer WF through the protective tape T. The frame fixing portion 71 includes a cylindrical support 710 for supporting the lower side of the frame F and a plurality of clamps 711 for pressing the upper side of the frame F. The wafer supporting portion 70 and the frame fixing portion 71 are relatively movable in the vertical direction.

As shown in FIG. 5, the wafer supporting portion 70 and the support 710 of the frame fixing portion 71 are initially set at the same level. In this condition, the wafer WF is placed on the upper end of the wafer supporting portion 70, and the frame F is fixed to the frame fixing portion 71. More specifically, the protective tape T attached to the front side W1 of the wafer WF is supported to the upper end of the wafer supporting portion 70, and the back side W2 of the wafer WF is exposed, or oriented upward.

Figure 6:
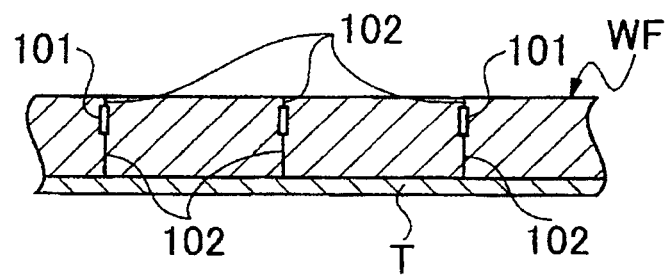
FIG. 6 is a sectional view showing grooves formed in the wafer by the dividing step.
Figure 7:
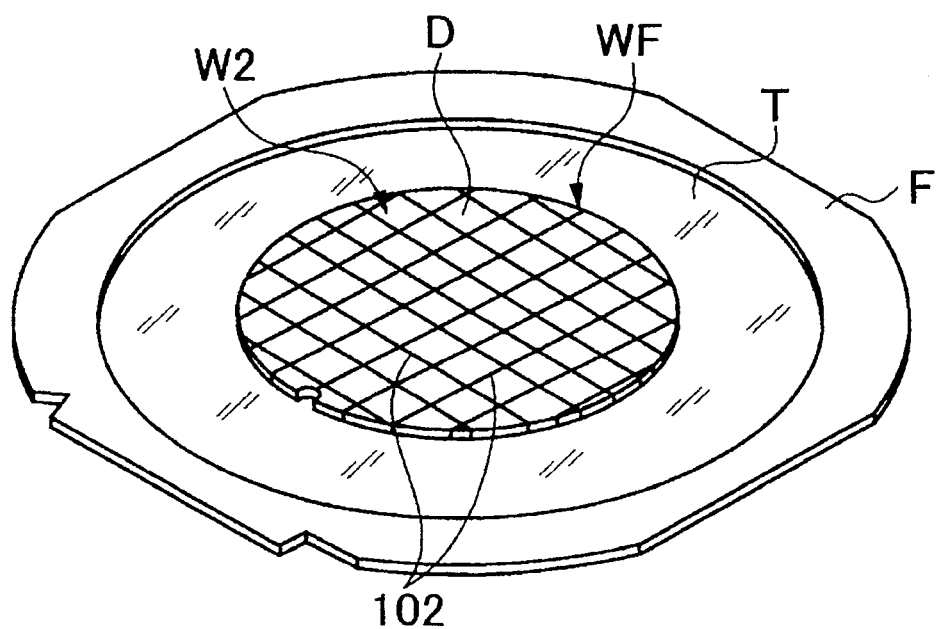
FIG. 7 is a perspective view of the wafer processed by the dividing step.

When the wafer supporting portion 70 is relatively raised from the frame fixing portion 71 as shown by a phantom line in FIG. 5, the protective tape T is expanded. As a result, a tensile force is horizontally applied to the wafer WF to thereby break the wafer WF from the modified layers 101 as a division start point, thereby forming a plurality of grooves 102 as shown in FIG. 6. As shown in FIG. 7, these grooves 102 are formed along all of the division lines L to obtain the individual devices D. Even after dividing the wafer WF, the individual devices D remain attached to the protective tape T to maintain the form of the wafer WF as a whole. While the protective tape T is attached to the front side W1 of the wafer WF before performing the division start point forming step in this preferred embodiment, the protective tape T may be attached to the front side W1 of the wafer WF after performing the division start point forming step and before performing the dividing step.

(3) Back Grinding Step

Figure 8:
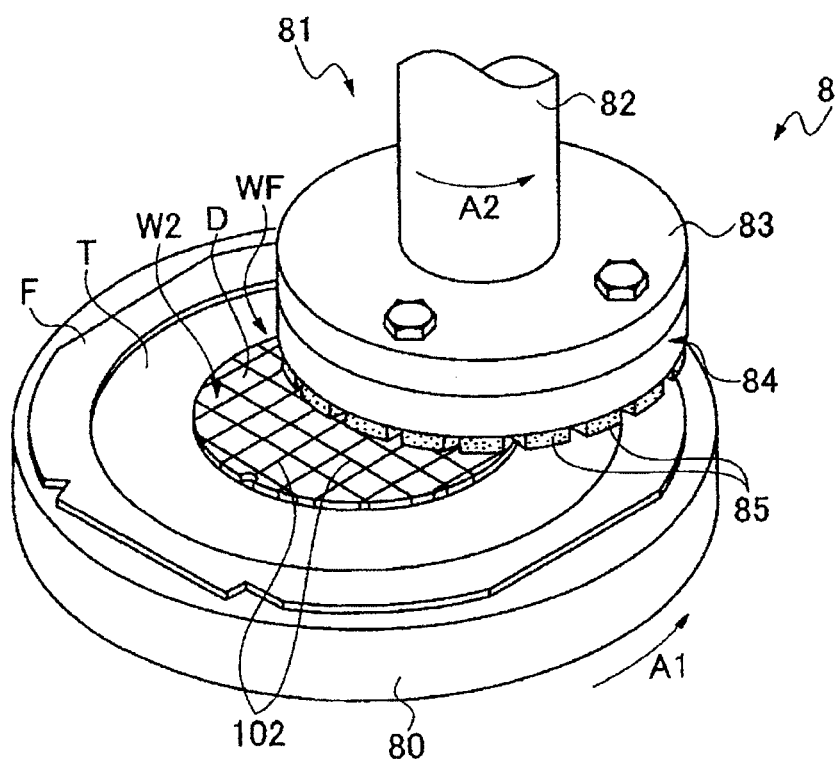
FIG. 8 is a perspective view showing a back grinding step.

After performing the dividing step, the back side W2 of the wafer WF divided into the individual devices D is ground by using a grinding apparatus 8 shown in FIG. 8. The grinding apparatus 8 includes a chuck table 80 for holding the wafer WF and grinding means 81 for grinding the wafer WF held on the chuck table 80. The grinding means 81 includes a spindle 82, a mount 83 formed at the lower end of the spindle 82, a grinding wheel 84 mounted on the lower surface of the mount 83, and a plurality of annularly arranged abrasive members 85 fixed to the lower surface of the grinding wheel 84.

In operation, the wafer WF supported through the protective tape T to the frame F is held on the chuck table 80 in the condition where the protective tape T comes into contact with the upper surface of the chuck table 80 and the back side W2 of the wafer WF is therefore exposed. The chuck table 80 thus holding the wafer WF is located below the grinding means 81 so that the back side W2 of the wafer WF is opposed to the abrasive members 85. In this condition, the chuck table 80 is rotated at 300 RPM, for example, in the direction shown by an arrow A1 in FIG. 8, and the spindle 82 is also rotated at 6000 RPM, for example, in the direction shown by an arrow A2 in FIG. 8. In this condition, the grinding means 81 is lowered to bring the rotating abrasive members 85 into contact with the back side W2 of the wafer WF, thereby grinding the back side W2. During the grinding operation, the abrasive members 85 are in contact with the back side W2 so as to always pass through the center of rotation of the wafer WF. When the thickness of the wafer WF is reduced to a predetermined thickness, i.e., the finished thickness T2 shown in FIG. 4, by this grinding operation, the grinding means 81 is raised to end the grinding operation.

As described above, each modified layer 101 shown in FIG. 4 is formed at a depth not reaching the finished thickness of each device D. Accordingly, when the thickness of the wafer WF is reduced to the finished thickness T2 of each device D by the grinding operation, each modified layer 101 is removed by the grinding operation. Accordingly, the side surface of each device D is formed by only a flat cleavage plane. At this time, the back side of each device D is referred to as a ground back side D2'.

(4) Groove Width Increasing Step

Figure 9:
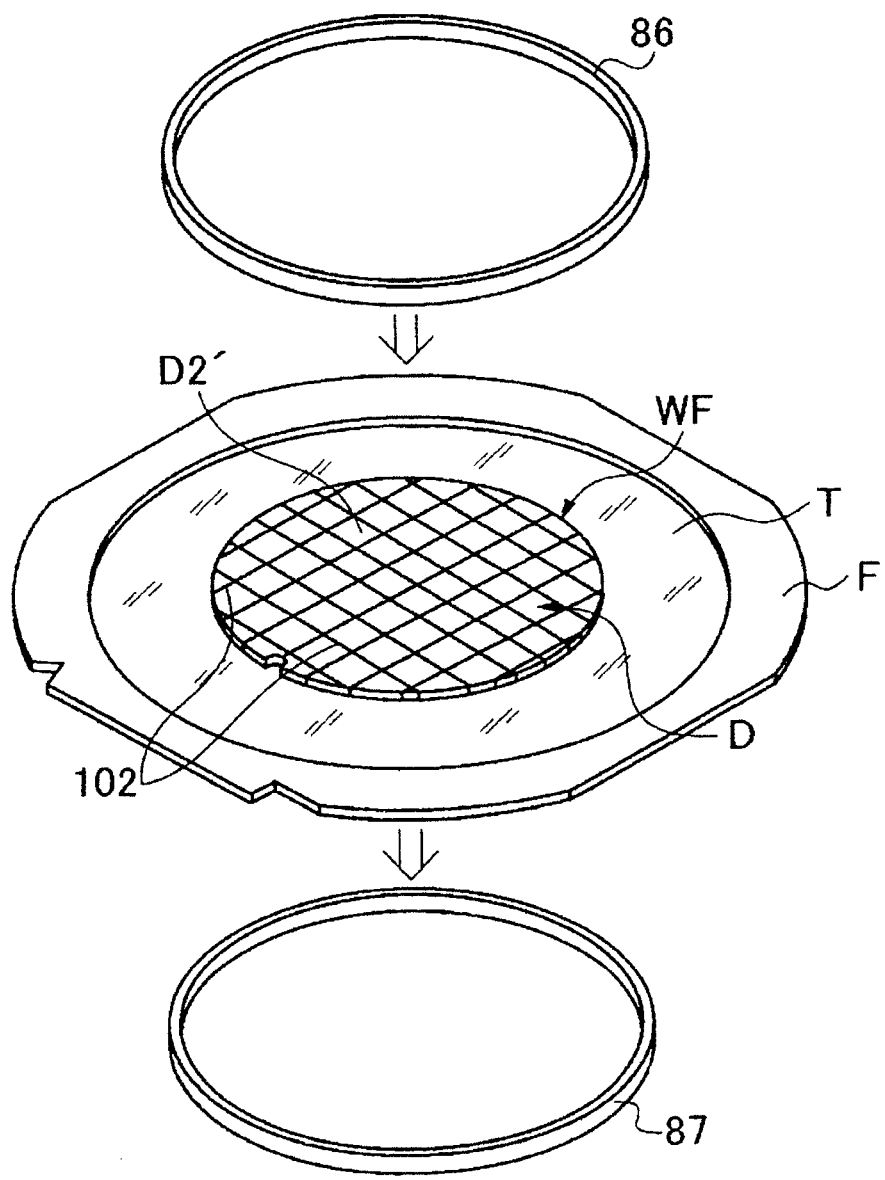
FIG. 9 is a perspective view showing a groove width increasing step.
Figure 10:
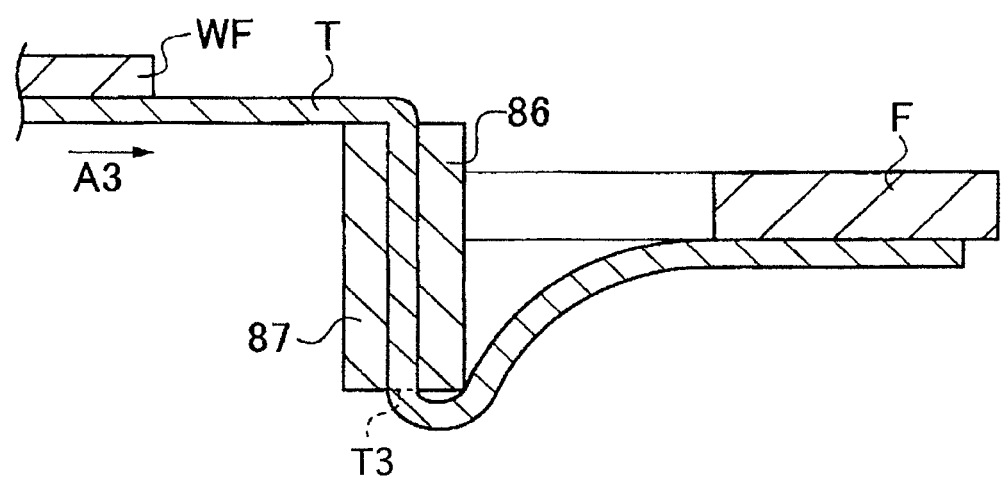
FIG. 10 is an enlarged sectional view showing a condition where the protective tape is sandwiched by ring members in the groove width increasing step.

This step is an optical step to be performed in the case that the width of each groove 102 between any adjacent ones of the devices D is not sufficient in forming a silicon nitride film on the side surface of each device D in the following silicon nitride film forming step. As shown in FIG. 9, a set of ring members 86 and 87 is prepared. The set of ring members 86 and 87 has an inner diameter larger than the diameter of the wafer WF and an outer diameter smaller than the inner diameter of the frame F. As apparent from FIG. 9, the inner diameter of the outer ring member 86 is slightly larger than the outer diameter of the inner ring member 87. As shown in FIG. 9, the outer ring member 86 is pressed against the protective tape T from the upper side thereof and the inner ring member 87 is pressed against the protective tape T from the lower side thereof in the condition that the ring members 86 and 87 are disposed between the wafer WF and the frame F. As a result, the protective tape T is sandwiched between the inner circumferential surface of the outer ring member 86 and the outer circumferential surface of the inner ring member 87 as shown in FIG. 10. Accordingly, the protective tape T is expanded in the direction shown by an arrow A3 in FIG. 10 to thereby increase the width of each groove 102 shown in FIG. 9.

(5) Silicon Nitride Film Forming Step

After performing the back grinding step or the groove width increasing step, a silicon nitride film forming step is performed to form a silicon nitride film on at least the side surface of each device D. The silicon nitride film may be formed by sputtering, for example. A sputtering apparatus 9 shown in FIG. 11 may be used for the formation of the silicon nitride film by sputtering. The sputtering apparatus 9 includes a chamber 90 having a gas inlet 91 and a gas outlet 92. An anode 93 and a cathode 94 are accommodated in the chamber 90 so as to be opposed to each other.

Figure 11:
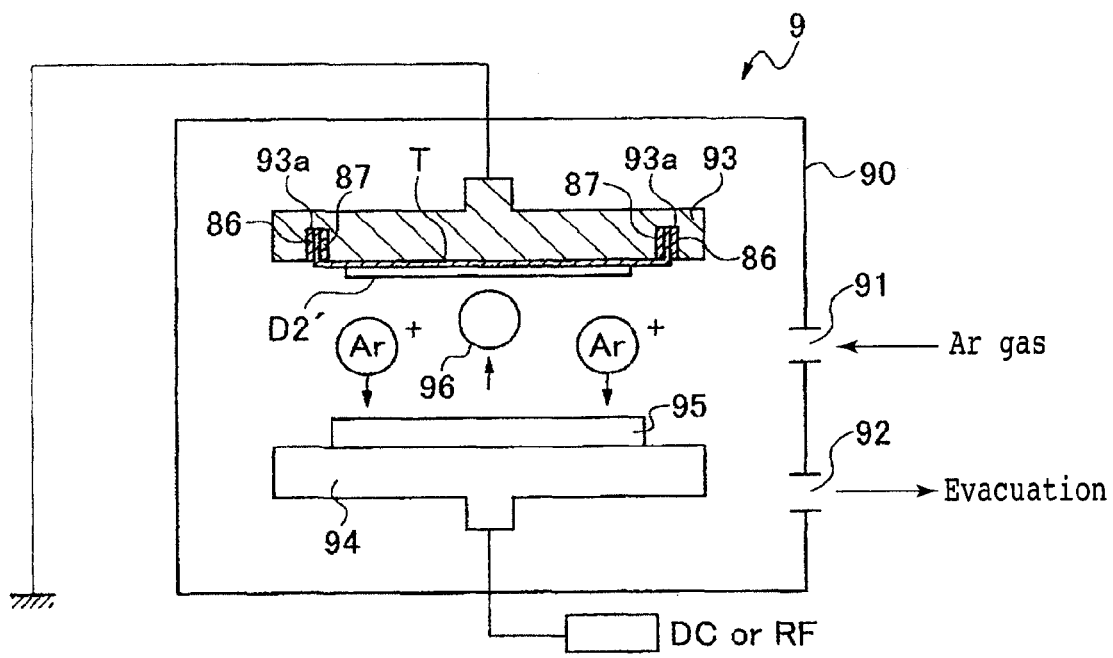
FIG. 11 is a schematic diagram showing the configuration of a sputtering apparatus for performing a silicon nitride film forming step.

Before holding the wafer WF to the anode 93, the protective tape T is cut at a position T3 shown in FIG. 10 to separate the frame F from the wafer WF. As shown in FIG. 11, the wafer WF is held through the protective tape T to the anode 93 in the condition where the ring members 86 and 87 and the peripheral portion of the protective tape T sandwiched therebetween are fitted in an annular groove 93a formed on the lower surface of the anode 93. In this condition, the central portion of the protective tape T is in contact with the lower surface of the anode 93, and the ground back side D2' of each device D is exposed. On the other hand, a target 95 of SiNx as the material of the silicon nitride film is held to the cathode 94. A magnetron cathode having a diameter of ϕ4 inches, for example, may be used as the cathode 94. In operating the sputtering apparatus 9, the chamber 90 is evacuated by removing inside gases from the gas outlet 92, and Ar gas and $N_2$ gas are next introduced from the gas inlet 91 into the chamber 90. For example, the Ar gas is introduced at a rate of 10 ml/min and the $N_2$ gas is introduced at a rate of 50 ml/min. The gas pressure in the chamber 90 is set to 0.3 Pa, for example.

Figure 12:
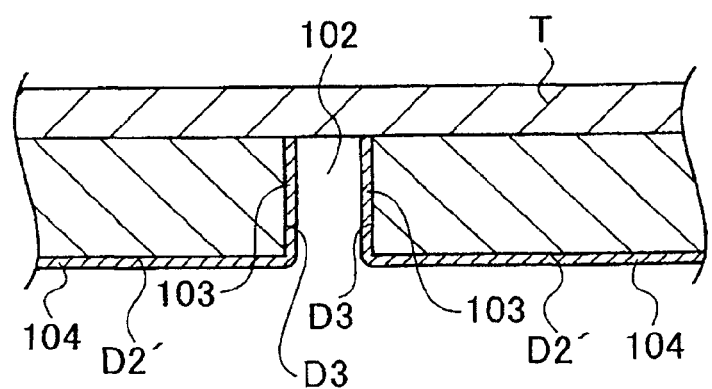
FIG. 12 is an enlarged sectional view showing a silicon nitride film formed on the side surface and back side of each device.

An RF voltage of 700 W, for example, is applied between the anode 93 and the cathode 94 to thereby generate a glow discharge. As a result, argon ions $Ar^+$ in the plasma collide with the target 95 on the cathode 94 to eject target atoms 96 from the surface of the target 95. The ejected target atoms 96 are attracted toward the anode 93, so that the target atoms 96 enter each groove 102 between any adjacent ones of the devices D to form a silicon nitride film 103 on the side surface D3 of each device D as shown in FIG. 12. At the same time, the target atoms 96 are also deposited on the ground back side D2' of each device D to form a silicon nitride film 104 on the ground back side D2' of each device D as shown in FIG. 12. In the present invention, it is essential to form a silicon nitride film on at least the side surface D3 of each device D. Accordingly, in the case that a silicon nitride film is not formed on the ground back side D2' of each device D, a mask member may be preliminarily attached to the whole surface of the ground back side D2'. Since the side surface D3 of each device D is formed by a flat cleavage plane, there is no or insufficient gettering effect on the side surface D3. However, by forming the silicon nitride film 103 on the side surface D3 of each device D, a gettering effect can be produced.

While the modified layers 101 are formed inside the wafer WF in the division start point forming step in this preferred embodiment mentioned above, the division start point forming step may be modified so that a laser beam having an absorption wavelength to the wafer WF is applied to the back side W2 of the wafer WF along the division lines L to perform ablation, thereby forming a plurality of division grooves exposed to the back side W2 along the division lines L. A modified layer is formed on the side surface of each division groove. This ablation may be performed under the following conditions, for example.

Light source: YAG laser
Wavelength: 355 nm (third harmonic generation of YAG laser)
Spot diameter: ϕ5 μm
Average power: 5.0 W
Repetition frequency: 50 kHz
Feed speed: 100 mm/sec As in the case of forming the modified layers 101 inside the wafer WF, the depth of each division groove is set to a depth not reaching the finished thickness T2 of each device D. Also in the case of forming the division grooves on the back side W2 of the wafer WF by ablation, the wafer WF can be divided into the individual devices D by applying a horizontal tensile force to the wafer WF in the dividing step.

Also in the back grinding step, the back side W2 of the wafer WF is ground to attain the finished thickness T2 of each device D. Since the division grooves are formed at a depth not reaching the finished thickness T2 of each device D, the division grooves are removed by this grinding operation. Accordingly, the side surface of each device D is formed by only a flat cleavage plane. Also in the following silicon nitride film forming step, a silicon nitride film is similarly formed on at least the side surface of each device D. As a modification, a back polishing step of polishing the ground back side D2' of each device D to remove a grinding strain may be additionally performed between the back grinding step and the groove width increasing step or the silicon nitride film forming step.

Example 1

A test was conducted to obtain the thickness of the silicon nitride film for suitably ensuring the gettering effect of each device D. More specifically, the back grinding step, the back polishing step to remove a grinding strain, and the silicon nitride film forming step mentioned above were performed to obtain various samples of each device D in which silicon nitride films having different thicknesses were formed on the side surfaces and back sides of the samples. These samples were used to conduct a gettering effect test, thereby examining the relation between the thickness of the silicon nitride film and the gettering effect of each device. Further, it was found that the formation of a silicon nitride film on each device causes a reduction in die strength. In this respect, a die strength test was also conducted. In conducting the above tests, the conditions of the wafer WF were set as follows:
  Wafer: silicon wafer
  Wafer diameter: 8 inches
  Wafer thickness (device thickness): 500 µm (after polishing the back side of the wafer)
  Device size: 20 mm×20 mm
  Number of devices per wafer: 61 (see FIG. 14)
(1) Gettering Effect Test
(A) Silicon Nitride Film Forming Step A plurality of wafers subjected to the dividing step, the back grinding step, and the back polishing step were prepared and the silicon nitride film forming step was performed to form silicon nitride films having different thicknesses of 1, 3, 5, 6, 7, 10, 50, 100, and 200 nm on the side surfaces and back sides of the devices of these wafers. Further, a wafer (device) without a silicon nitride film was also prepared, in which no silicon nitride film was formed on the side surface and back side of each device subjected to the back grinding step and the back polishing step. All of these devices were subjected to the following steps (B) to (D).
(B) Forced Contamination Step A Cu standard solution (copper sulfate) was applied in an amount of $1.0 \times 10^{13}$ atoms/cm² to the back sides of all the wafers each having a diameter of 8 inches, in which the silicon nitride films having the above-mentioned different thicknesses were formed on the side surfaces and back sides of the devices. Thus, forced contamination of the devices with copper was made.
(C) Heating Step After drying the coating of the Cu standard solution on the side surfaces and back sides of all the devices, they were heated at 350° C. for three hours to obtain a condition where the copper atoms in each device were easily diffused.
(D) Measuring Step After cooling all the devices, the amount of copper atoms on the other side (front side) of each device opposite to the back side coated with the Cu standard solution was measured by using TXRF (total reflection X-ray fluorescence analyzing apparatus manufactured by Technos Co., Ltd.). More specifically, the front side of each wafer was partitioned into a plurality of regions each having a size of 15 mm×15 mm, and the amount of copper atoms in each region was measured to obtain the mean value and the maximum value of the amounts of copper atoms in all of the regions. Further, also before performing the forced contamination step, the amount of copper atoms on the front side of each device was measured by a similar method.

In the case that copper atoms were detected on the front side of each device in this step, it can be determined that copper atoms were diffused in each device and that the gettering effect was zero or insufficient. Conversely, in the case that copper atoms were not detected on the front side of each device, it can be determined that copper atoms were trapped on the silicon nitride film and that the gettering effect was sufficient. The test result is shown in FIG. 13. The threshold (detection limit) for determination whether or not copper atoms were detected was set to $0.5 \times 10^{10}$ atoms/cm².

Figure 14:
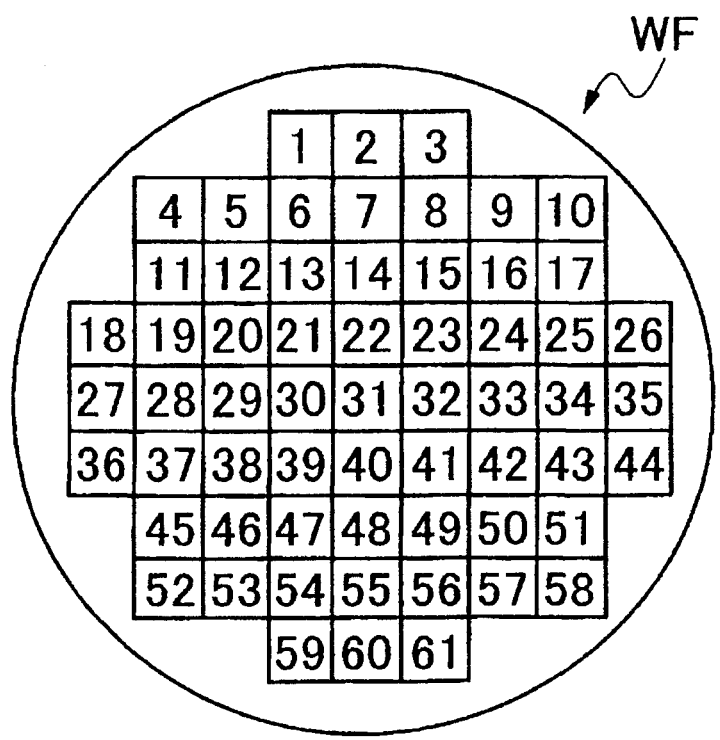
FIG. 14 is a plan view showing the configuration of the wafer subjected to a die strength test.

As apparent from the test result shown in FIG. 13, in the case that the forced contamination step was performed and that the thickness of the silicon nitride film was 5 nm or less, copper atoms were detected on the front side of each device both at the mean value and at the maximum value, so that it was confirmed that the gettering effect was zero or insufficient. In contrast, in the case that the forced contamination step was performed and that the thickness of the silicon nitride film was 6 nm or more, copper atoms were not detected on the front side of each device both at the mean value and at the maximum value, so that it was confirmed that the gettering effect was sufficient (ND in FIG. 13 indicates that copper atoms were not detected). Accordingly, it is considered that the thickness of the silicon nitride film must be set to 6 nm or more to ensure a sufficient gettering effect. Further, it is also apparent from FIG. 13 that the larger the thickness of the silicon nitride film, the better the gettering effect.
(2) Die Strength Test As shown in FIG. 14, the wafer WF is composed of 61 chips numbered by 1 to 61. After performing the silicon nitride film forming step, each device of the wafer WF was subjected to the measurement of a die strength. In the silicon nitride film forming step, a plurality of silicon nitride films having different thicknesses of 0, 5, 10, 50, 100, and 200 nm were formed. The measurement of a die strength was made by the following specific method.
(E) Die Strength Measuring Step The die strength of each device was measured by using a compression tester (AGI-1kN9) manufactured by Shimadzu Corporation. A specific measuring method for the die strength is as follows:
(E-1)

Figure 15:
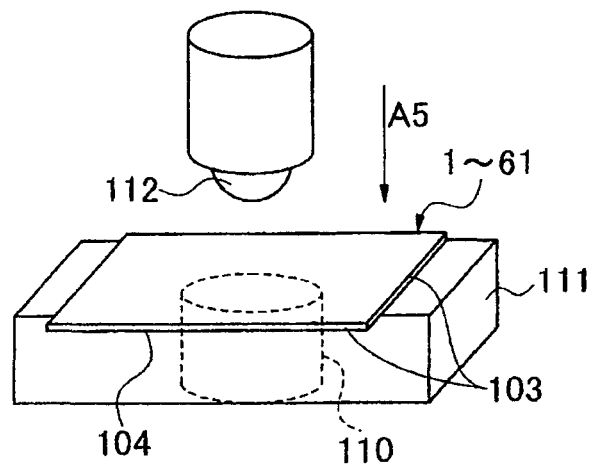
FIG. 15 is a perspective view showing the die strength test.
Figure 16:
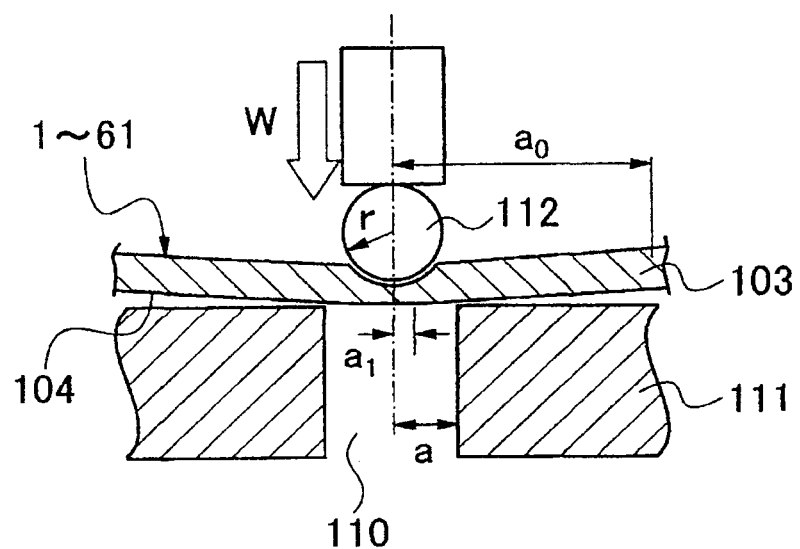
FIG. 16 is a sectional view showing the die strength test.

As shown in FIGS. 15 and 16, each of the chips 1 to 61 is placed on a base 111 having a central circular hole 110 in the condition where the silicon nitride film 104 formed on the back side of each chip is oriented downward.
(E-2)

A pressure is applied to each of the chips 1 to 61 downward (in the direction shown by an arrow A5 in FIG. 15) by using a pressure ball 112 having a spherical surface.
(E-3)

At the moment of fracture of each of the chips 1 to 61, a die strength δ is calculated by using Eq. (1) shown below $$\delta = \frac{3W9.8}{4\pi h^2}\left[(1+\nu)\left\{\frac{8}{3}+2\mathrm{Ln}\frac{a}{a_1}-2\mathrm{Ln}2\right\}+(1-\nu)\frac{a^2}{a_0^2}\left\{1-\frac{2}{5}\frac{a_1^2}{a^2}\right\}\right] \quad \text{Eq. (1)}$$

The definition and value of each variable in Eq. (1) are as follows (see FIG. 16):
  ∂: Die strength
  W: Fracture strength (measured value) kgf
  h: Chip thickness=500 µm
  ν: Poisson's ratio (silicon)=0.28
  a: Hole radius=3.5 mm
  $a_0$: Chip radius=10 mm $a_1$ is the radius of contact between the pressure ball 112 and each chip and it is calculated by using Eq. (2) shown below.

$$a_1 = \left\{ \frac{3}{4} r \left( \frac{1-v^2}{\varepsilon_1} + \frac{1-v_2^2}{\varepsilon_2} \right) w \right\}^{\frac{1}{3}} \qquad \text{Eq. (2)}$$

The definition and value of each variable in Eq. (2) are as follows:
- $\varepsilon_1$: Young's modulus (silicon)=$1.31 \times 10^5$ MPa
- $\varepsilon_2$: Young's modulus (pressure ball)=$2.01 \times 10^4$ MPa
- r: Pressure ball radius=3.0 mm
- $v_2$: Poisson's ratio (pressure ball)=0.3

Figure 17:
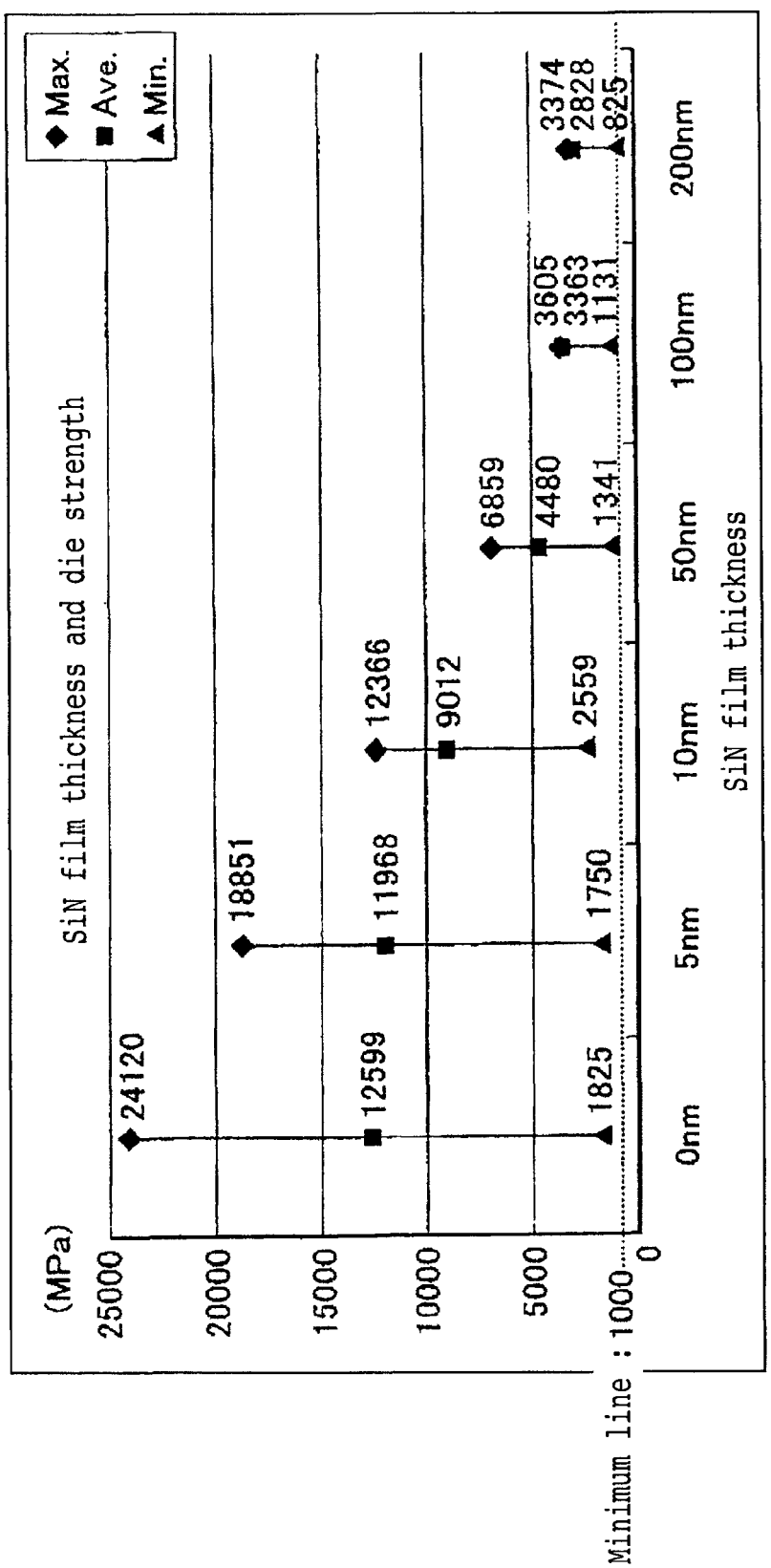
FIG. 17 is a graph showing the result of the die strength test.

The die strength of each chip was measured to obtain a maximum value, mean value, and minimum value. This measurement was made for the different thicknesses of the silicon nitride films. As shown in FIG. 17, the minimum value of the die strength (the minimum acceptable limit of the die strength) is set to 1000 MPa, and the film thickness providing a minimum value higher than 1000 MPa for the die strength is 0 to 100 nm. In contrast, when the film thickness is 200 nm, the minimum value for the die strength is lower than 1000 MPa.

(3) Optimum Film Thickness

As described above, the thickness of the silicon nitride film must be set to 6 nm or more to ensure a sufficient gettering effect as apparent from the result of the gettering effect test shown in FIG. 13. Further, in order to ensure a sufficient die strength greater than an acceptable limit, the thickness of the silicon nitride film must be set to 0 to 100 nm. Accordingly, in order to ensure both a sufficient gettering effect and a sufficient die strength, the film thickness of the silicon nitride film to be formed on the side surface of each device must be set to 6 to 100 nm.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A device processing method for processing a plurality of devices obtained by dividing a wafer composed of a silicon substrate and said plurality of devices formed on a front side of said silicon substrate so as to be partitioned by a plurality of division lines, said device processing method comprising:
   a division start point forming step of applying a laser beam to said wafer along said division lines from a back side of said wafer, thereby forming a plurality of modified layers as a division start point inside said wafer along said division lines at a depth not reaching a finished thickness of each device;
   a protective member attaching step of attaching a protective member to the front side of said wafer before or after performing said division start point forming step;
   a dividing step of applying an external force through said protective member to said wafer after performing said protective member attaching step and said division start point forming step, thereby dividing said wafer along said division lines to obtain said individual devices;
   a back grinding step of grinding the back side of said wafer after performing said dividing step, thereby removing said modified layers; and
   a silicon nitride film forming step of forming a silicon nitride film on at least a side surface of each device after performing said back grinding step.

2. The device processing method according to claim 1, wherein said silicon nitride film is formed both on the side surface of each device and on a back side of each device in said silicon nitride film forming step.

3. The device processing method according to claim 1, wherein the thickness of said silicon nitride film to be formed in said silicon nitride film forming step is set to 6 to 100 nm.

* * * * *